(12) United States Patent
Basin et al.

(10) Patent No.: US 10,090,444 B2
(45) Date of Patent: Oct. 2, 2018

(54) WAVELENGTH CONVERTED LIGHT EMITTING DEVICE WITH SMALL SOURCE SIZE

(71) Applicant: KONINKLIJKE PHILIPS N.V., Eindhoven (NL)

(72) Inventors: Grigoriy Basin, San Francisco, CA (US); Brendan Jude Moran, San Jose, CA (US); Hideo Kageyama, Santa Clara, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/318,143

(22) PCT Filed: Jun. 5, 2015

(86) PCT No.: PCT/IB2015/054261
§ 371 (c)(1),
(2) Date: Dec. 12, 2016

(87) PCT Pub. No.: WO2015/193763
PCT Pub. Date: Dec. 23, 2015

(65) Prior Publication Data
US 2017/0133559 A1    May 11, 2017

Related U.S. Application Data

(60) Provisional application No. 62/014,288, filed on Jun. 19, 2014.

(51) Int. Cl.
*H01L 33/50* (2010.01)
*H01L 33/60* (2010.01)

(52) U.S. Cl.
CPC ............ *H01L 33/505* (2013.01); *H01L 33/60* (2013.01); *H01L 2933/0041* (2013.01)

(58) Field of Classification Search
CPC ..... H01L 33/50; H01L 33/502; H01L 33/505; H01L 33/507; H01L 33/60; H01L 33/46; H01L 27/15; H01L 27/153; H01L 27/156
See application file for complete search history.

(56) References Cited

U.S. PATENT DOCUMENTS

2009/0155943 A1    6/2009   Krames et al.
2010/0264438 A1   10/2010   Suenaga
(Continued)

FOREIGN PATENT DOCUMENTS

EP    2511963 A2    10/2012
JP    2007-019096 A    1/2007
(Continued)

OTHER PUBLICATIONS

EPO as ISA, "International Search Report and Written Opinion" dated Oct. 27, 2015 from International Application No. PCT/IB2015/054261, filed Jun. 5, 2015, 14 pages.

*Primary Examiner* — Tucker J Wright
(74) *Attorney, Agent, or Firm* — Volpe and Koenig, P.C.

(57) ABSTRACT

A lighting structure according to embodiments of the invention includes a semiconductor light emitting device and a flat wavelength converting element attached to the semiconductor light emitting device. The flat wavelength converting element includes a wavelength converting layer for absorbing light emitted by the semiconductor light emitting device and emitting light of a different wavelength. The flat wavelength converting element further includes a transparent layer. The wavelength converting layer is formed on the transparent layer.

19 Claims, 4 Drawing Sheets

(56) References Cited

U.S. PATENT DOCUMENTS

| | | | |
|---|---|---|---|
| 2010/0295077 A1* | 11/2010 | Melman | H01L 33/50 |
| | | | 257/98 |
| 2010/0320479 A1 | 12/2010 | Minato et al. | |
| 2011/0049545 A1* | 3/2011 | Basin | H01L 33/56 |
| | | | 257/98 |
| 2011/0309384 A1 | 12/2011 | Ito et al. | |
| 2012/0025218 A1* | 2/2012 | Ito | H01L 33/505 |
| | | | 257/88 |
| 2012/0033402 A1 | 2/2012 | Harada | |
| 2012/0153330 A1 | 6/2012 | Tsutsui | |
| 2012/0241793 A1* | 9/2012 | In | H01L 33/486 |
| | | | 257/98 |
| 2013/0187174 A1 | 7/2013 | Tischler | |

FOREIGN PATENT DOCUMENTS

| | | |
|---|---|---|
| JP | 2007019096 A | 1/2007 |
| WO | 2012023119 A1 | 2/2012 |

\* cited by examiner

WAVELENGTH CONVERTED LIGHT EMITTING DEVICE WITH SMALL SOURCE SIZE

CROSS-REFERENCE TO RELATED APPLICATIONS

The present application is a § 371 application of International Application No. PCT/IB2015/054261 filed on Jun. 5, 2015 and entitled "WAVELENGTH CONVERTED LIGHT EMITTING DEVICE WITH SMALL SOURCE SIZE," which claims the benefit of U.S. Provisional Application No. 62/014,288, filed Jun. 19, 2014. International Application No. PCT/IB2015/054261 and U.S. Provisional Application No. 62/014,288 are incorporated herein.

FIELD OF THE INVENTION

The present invention relates to a wavelength converted semiconductor light emitting device.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

FIGS. 1A, 1B, 1C, and 1D illustrate a method of forming a phosphor-converted LED, described in more detail in US 2013/0187174. In FIG. 1A, a base 410 is provided and light emitting elements (LEEs) 210 are placed on or adhered to base 410 with contacts 220 adjacent to base 410. The LEEs 210 have a spacing 405 between adjacent elements. Base 410 may also be referred to as a "mold substrate." In one embodiment, base 410 includes or consists essentially of an adhesive film or tape. In some embodiments, base 410 includes or consists essentially of a material to which has a relatively low adhesion to phosphor 230, that is, it permits removal of cured phosphor 230 from base 410.

In FIG. 1B, barriers 450 are formed. Barriers 450 are shown as perpendicular or substantially perpendicular to a surface 435. The spacing 405 between adjacent LEEs 210 may be adjusted to control the width of cured phosphor 230 around the sides of LEEs 210 as shown in FIG. 1D. Spacing 405 between LEEs 210 is approximately determined by the sum of twice the desired sidewall thickness of the phosphor and the kerf (where the kerf is the width of the region removed during the singulation process of finished dies 200, for example identified as kerf 470 in FIG. 1D. The thickness of cured phosphor 230 over the LEEs 210 may be controlled by controlling a thickness 425 of phosphor 420 that is formed or dispensed as shown in FIG. 1B. Thickness 260 of cured phosphor 230 over LEE 210 is given approximately by the thickness of dispensed phosphor, 425 less the thickness 445 of the LEE. Phosphor 420 includes or consists essentially of a phosphor and a binder. Phosphor 420 is contained or bounded by surface 435 of base 410 and optional sides or barriers 450. Phosphor 420 has a bottom surface or face 460 and a top surface or face 440, which are substantially parallel to each other.

Phosphor 420 is then cured, producing cured phosphor 230 as shown in FIG. 1C.

In FIG. 1D, white dies 200 are separated or singulated from the structure shown in FIG. 1D. White dies 200 may have a size ranging from about 0.25 mm to about 5 mm.

SUMMARY

It is an object of the invention to provide a wavelength converted semiconductor light emitting device with a small source size.

A lighting structure according to embodiments of the invention includes a semiconductor light emitting device and a flat wavelength converting element attached to the semiconductor light emitting device. The flat wavelength converting element includes a wavelength converting layer for absorbing light emitted by the semiconductor light emitting device and emitting light of a different wavelength. The flat wavelength converting element further includes a transparent layer. The wavelength converting layer is formed on the transparent layer.

A method according to embodiments of the invention includes forming a wavelength converting element including a wavelength converting layer disposed on a transparent layer. The wavelength converting element is then attached to a wafer of semiconductor light emitting devices. The wavelength converting element and the wafer of semiconductor light emitting devices are then diced to form a plurality of lighting elements. The plurality of lighting elements are then disposed on a handling substrate. A reflective material is disposed between the plurality of lighting elements.

A method according to embodiments of the invention includes forming a wavelength converting element, the wavelength converting element including a wavelength converting layer disposed on a transparent layer. The wavelength converting element is then attached to a plurality of diced semiconductor light emitting devices disposed on a handling substrate. The wavelength converting element is then diced to form a plurality of lighting elements.

DETAILED DESCRIPTION

Figure 1A:
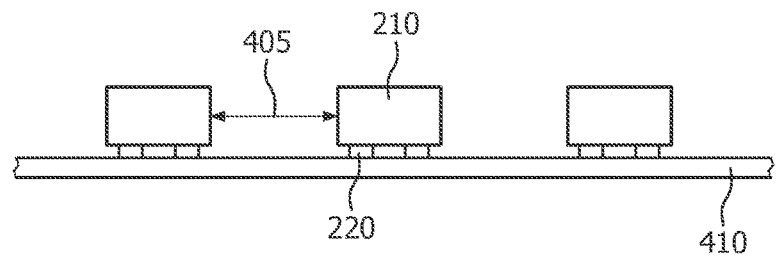
FIGS. 1A, 1B, 1C, and 1D illustrate a method of forming a phosphor-converted light emitting element.
Figure 1B:
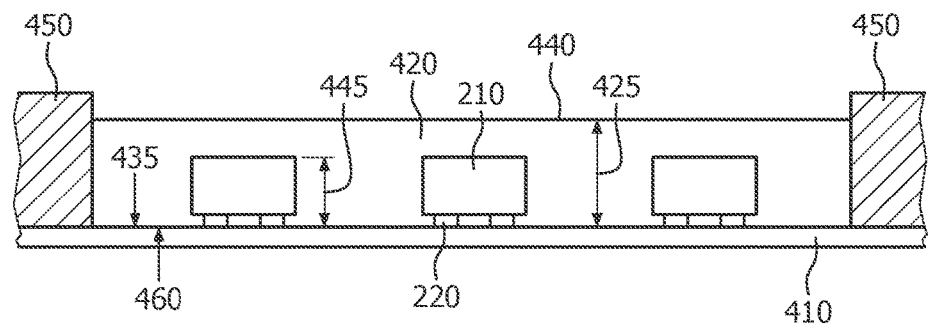
Figure 1C:
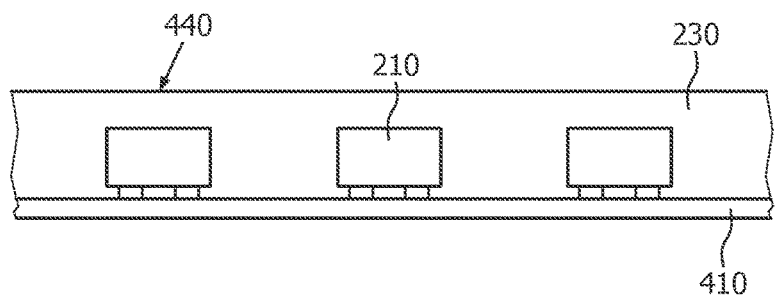
Figure 1D:
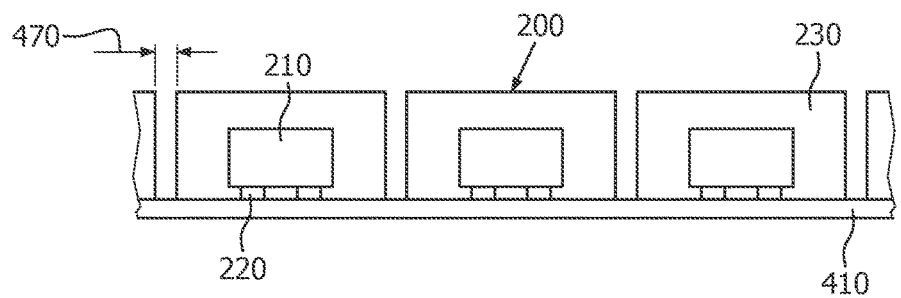

Because the phosphor extends over the edges of the LEE in FIG. 1D, the devices illustrated in FIG. 1D have a larger source size than the light emitting diode without the phosphor layer. Because of the large source size, the devices illustrated in FIG. 1D may be less bright than the same amount of light emitted in a smaller source size. The large source size makes the devices illustrated in FIG. 1D undesirable in some applications.

Embodiments of the invention include wavelength converted devices with a relatively small source size, which may be inexpensive to manufacture.

Though in the examples below the semiconductor light emitting device are III-nitride LEDs that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

Figure 2:
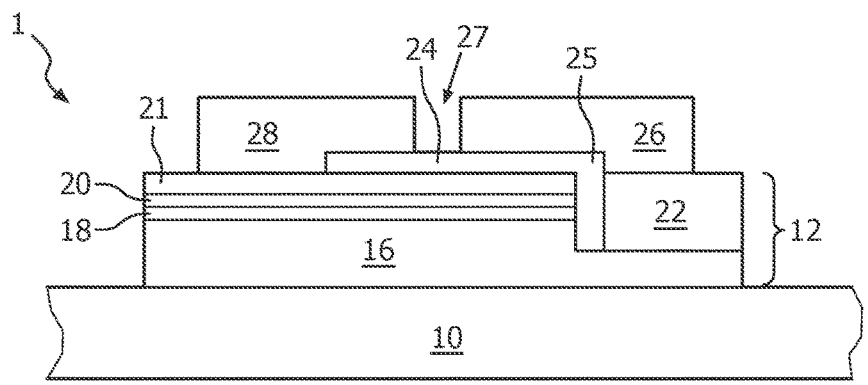
FIG. 2 illustrates one example of a III-nitride LED.

FIG. 2 illustrates a III-nitride LED 1 that may be used in embodiments of the present invention. Any suitable semiconductor light emitting device may be used and embodiments of the invention are not limited to the device illustrated in FIG. 2. The device of FIG. 2 is formed by growing a III-nitride semiconductor structure on a growth substrate 10 as is known in the art. The growth substrate is often sapphire but may be any suitable substrate such as, for example, SiC, Si, GaN, or a composite substrate. A surface of the growth substrate on which the III-nitride semiconductor structure is grown may be patterned, roughened, or textured before growth, which may improve light extraction from the device. A surface of the growth substrate opposite the growth surface (i.e. the surface through which a majority of light is extracted in a flip chip configuration) may be patterned, roughened or textured before or after growth, which may improve light extraction from the device.

The semiconductor structure includes a light emitting or active region sandwiched between n- and p-type regions. An n-type region 16 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 18 is grown over the n-type region. Examples of suitable light emitting regions include a single thick or thin light emitting layer, or a multiple quantum well light emitting region including multiple thin or thick light emitting layers separated by barrier layers. A p-type region 20 may then be grown over the light emitting region. Like the n-type region, the p-type region may include multiple layers of different composition, thickness, and dopant concentration, including layers that are not intentionally doped, or n-type layers.

After growth, a p-contact is formed on the surface of the p-type region. The p-contact 21 often includes multiple conductive layers such as a reflective metal and a guard metal which may prevent or reduce electromigration of the reflective metal. The reflective metal is often silver but any suitable material or materials may be used. After forming the p-contact 21, a portion of the p-contact 21, the p-type region 20, and the active region 18 is removed to expose a portion of the n-type region 16 on which an n-contact 22 is formed. The n- and p-contacts 22 and 21 are electrically isolated from each other by a gap 25 which may be filled with a dielectric such as an oxide of silicon or any other suitable material. Multiple n-contact vias may be formed; the n- and p-contacts 22 and 21 are not limited to the arrangement illustrated in FIG. 2. The n- and p-contacts may be redistributed to form bond pads with a dielectric/metal stack, as is known in the art.

In order to form electrical connections to the LED 1, one or more interconnects 26 and 28 are formed on or electrically connected to the n- and p-contacts 22 and 21. Interconnect 26 is electrically connected to n-contact 22 in FIG. 2. Interconnect 28 is electrically connected to p-contact 21. Interconnects 26 and 28 are electrically isolated from the n- and p-contacts 22 and 21 and from each other by dielectric layer 24 and gap 27. Interconnects 26 and 28 may be, for example, solder, stud bumps, gold layers, or any other suitable structure. The semiconductor structure, n- and p-contacts 22 and 21, and interconnects 26 and 28 are shown in the following figures as LED structure 12.

The substrate 10 may be thinned or entirely removed. In some embodiments, the surface of substrate 10 exposed by thinning is patterned, textured, or roughened to improve light extraction.

Many individual LEDs are formed on a single wafer then diced from a wafer of devices. Any suitable device may be used. The invention is not limited to the particular LED illustrated in FIG. 2. The combined thickness of substrate 10 and LED structure 12 may be at least 50 µm in some embodiments, no more than 500 µm in some embodiments, at least 100 µm in some embodiments, and no more than 250 µm in some embodiments. The substrate 10 may be no more than 250 µm thick in some embodiments, no more than 150 µm thick in some embodiments, and at least 100 µm thick in some embodiments.

Figure 3:
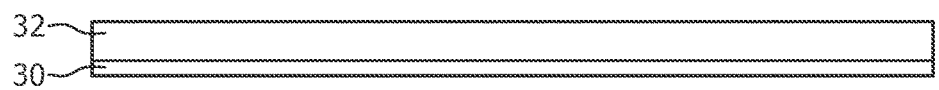
FIG. 3 illustrates a wavelength converting layer disposed on a transparent layer.

Separate from the LEDs, a wavelength converting element is formed, as illustrated in FIG. 3. The wavelength converting element includes a support substrate 30 and a wavelength converting layer 32. The wavelength converting element is formed on a wafer scale, meaning that the wavelength converting element illustrated in FIG. 3 can be thought of as a wafer of many individual wavelength converting elements.

In some embodiments, the support substrate 30 becomes part of the light emitting device. In these embodiments, the support substrate 30 may be transparent to the light emitted by the LED and/or the light emitted by the phosphor. The support substrate may also be sufficiently robust to withstand any processing steps that occur after attaching the wavelength converting element to an LED and to withstand the operating conditions of the light emitting device, and may be formed of a material that is optically suitable for the light emitting device. The support substrate 30 may be, for example, glass, silicone, polymer, polyethylene terephthalate (PET), or any other suitable material.

In some embodiments, the support substrate 30 is removed, and does not become part of the light emitting device. In these embodiments, the support substrate 30 material is selected for cost and suitability for the processing steps to which the support substrate 30 is subjected. If the support substrate 30 is removed after processing, the support substrate need not be transparent.

The wavelength converting layer 32 includes a wavelength converting material which may be, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce. The wavelength converting material absorbs light emitted by the LED and emits light of one or more different wavelengths. Unconverted light emitted by the LED is often part of the final spectrum of light extracted from the structure, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting materials, and a UV-emitting LED combined with blue-, green-, and red-emitting wavelength converting materials. Wavelength converting materials emitting other colors of light may be added to tailor the spectrum of light extracted from the structure.

The wavelength converting layer 32 may include a transparent material such as silicone that is mixed with the wavelength converting material. The wavelength converting layer 32 is formed and attached to the support substrate 30 by any suitable technique. In some embodiments, a wavelength converting layer 32 that is a wavelength converting material mixed with a transparent material is dispensed, screen printed, stenciled, spin-casted, laminated, molded or otherwise formed on a glass support substrate 30. The wavelength converting layer 32 may be formed by a process that includes curing, for example by exposing the wavelength converting layer to light and/or to elevated temperature. For example, a laminated wavelength converting layer 32 may be cured at a temperature greater than 120° C. in some embodiments and less than 180° C. in some embodiments. In some embodiments the wavelength converting layer 32 is partially cured when it is disposed on the support substrate, and partially cured during a later processing step such as, for example, when it is attached to light emitting devices.

The wavelength converting layer 32 may have a thickness of at least 30 µm in some embodiments, no more than 100 µm in some embodiments, at least 50 µm in some embodiments, and no more than 80 µm in some embodiments. The support substrate 30 may be thinner than the wavelength converting layer 32 in some embodiments, though this is not required. A transparent support substrate 30 such as glass may have a thickness of at least 10 µm in some embodiments, at least 20 µm in some embodiments, no more than 200 µm in some embodiments, no more than 150 µm in some embodiments, no more than 60 µm in some embodiments, and no more than 50 µm in some embodiments.

Figure 4:
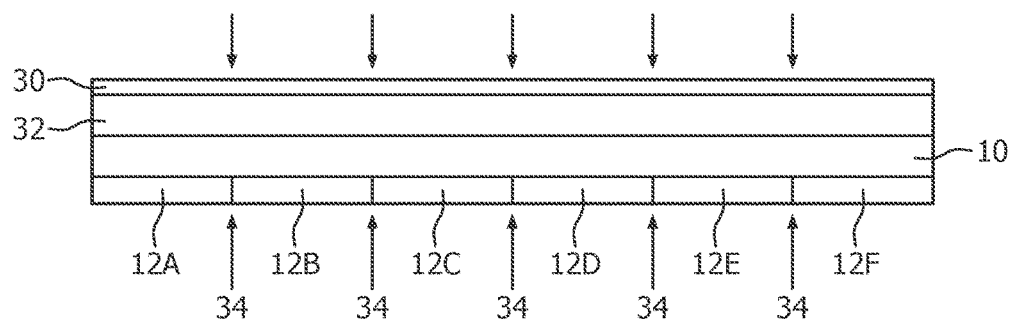
FIG. 4 illustrates the structure of FIG. 3 attached to a wafer of LEDs.

In FIG. 4, the wavelength converting element illustrated in FIG. 3 is attached to a wafer of LEDs before the LED wafer is diced. The surface of the wavelength converting layer 32 opposite the support substrate 30 is attached to the surface of substrate 10 opposite the LED structures 12A-12F. The wavelength converting element may be attached to the LED wafer by any suitable technique, such as gluing with silicone or any other suitable adhesive, or heating the wavelength converting element such that the transparent material in the wavelength converting layer 32 adheres to the substrate 10.

The structure illustrated in FIG. 4 is then diced into individual LEDs, or groups of LEDs. The structure illustrated in FIG. 4 is diced for example by cutting through the support substrate 30, the wavelength converting layer 32, the substrate 10, and a portion of the LED structures 12A-12F in the regions 34 illustrated in FIG. 4. The layers may be cut together in a single cutting step, or individual layers may be separately cut in multiple cutting steps. For example, the substrate 10 and LED structure 12 may be cut by, for example, scribing and breaking, before or after the support substrate 30 and wavelength converting layer 32 are cut by, for example, sawing. Any suitable cutting technique(s) may be used such as, for example, sawing, laser scribing, scribe-and-break, blade cutting, or any other suitable process. Though only six individual LEDs are illustrated in FIG. 4, an LED wafer may include many more individual LEDs.

Figure 5:
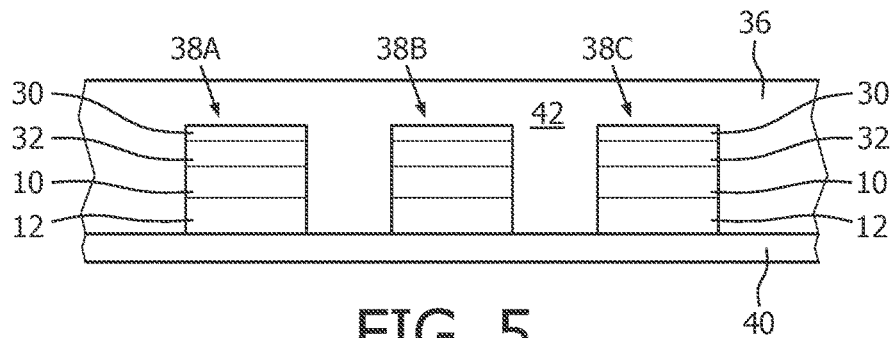
FIG. 5 illustrates the structure of FIG. 4 after dicing the wafer into individual LEDs, attaching the LEDs to a handling substrate, and forming a reflective material over the LEDs.

In FIG. 5, the LEDs that were diced in FIG. 4 are placed on a handling substrate 40. Only a portion of a single handling substrate 40 including three LEDs 38A, 38B, and 38C is illustrated in FIG. 5. The processes illustrated in FIGS. 5 and 6 may be undertaken at a scale where hundreds or thousands of LEDs are disposed on a single handling substrate 40. The handling substrate 40 is any suitable structure from which the LEDs may be later removed, such as, for example, wafer handling tape. The LEDs may be spaced at least 100 µm apart in some embodiments, at least 150 µm apart in some embodiments, at least 200 µm apart in some embodiments, and no more than 500 µm apart in some embodiments.

A reflective material 36 is disposed over LEDs 38A, 38B, and 38C. Reflective material may be, for example, white or reflective particles such as $TiO_2$ disposed in a transparent material. The reflective particles and the transparent material may form a contrast in index of refraction, which scatters and/or reflects light. The reflective material may be formed by any suitable technique; for example the reflective material may be molded, dispensed, laminated, or otherwise disposed over the LEDs.

Figure 6:
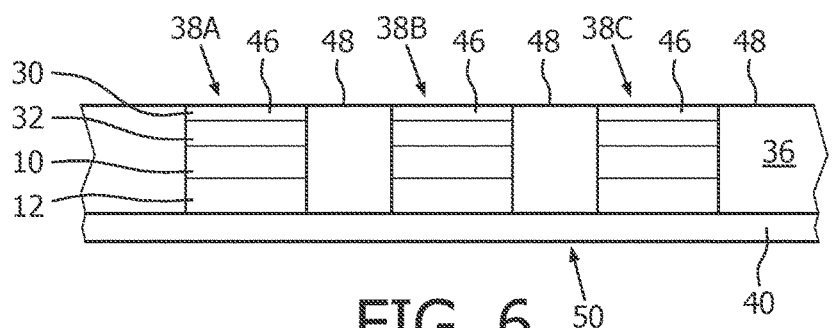
FIG. 6 illustrates the structure of FIG. 5 after removing excess reflective material.

In some embodiments, as illustrated in FIG. 5, excessive 42 reflective material 36 is formed over the tops of LEDs 38A, 38B, and 38C. The excessive material 42 illustrated in FIG. 5 may be removed, as illustrated in FIG. 6. The excessive material 42 may be removed by any suitable technique, including dry bead blasting, wet bead blasting, grinding, polishing, mechanical techniques, or etching. After the excessive material is removed, the tops 46 of LEDs 38A, 38B, and 38C are exposed. The top surface 46 is a surface of support substrate 30 opposite the wavelength converting layer 32. In some embodiments, the technique for removing excessive material 42 is selected to roughen, polish, texture, or pattern the top surface 46, for example to improve light extraction from the device. Alternatively, the top surface may be roughened, polished, textured, or patterned in a separate processing step.

In some embodiments, after removing the excessive material 42 shown in FIG. 5, the top surface 48 of reflective material 36 between LEDs is at the same level as the top surface of LEDs 38A, 38B, 38C. In some embodiments, as illustrated in FIG. 6, after removing the excessive reflective material, the top surface 48 of reflective material 36 between LEDs is at a different level than the top surface of LEDs 38A, 38B, 38C. In particular, the top surface 48 of reflective material 36 between LEDs may be below the top surface of LEDs 38A, 38B, 38C. Reducing the thickness of the reflective material to below the top surface of the LEDs may be useful, for example, in embodiments as described below where the support substrate 30 is removed after forming the reflective material.

The LEDs may then be separated into individual devices or groups of devices by cutting the reflective material between LEDs, for example in regions 50 illustrated in FIG. 6. The LEDs may then be removed from the handling substrate 40 by any technique suitable to the particular handling substrate used. Because reflective material 36 is disposed on the sides of the LED, light is extracted from the final device primarily through the top surface of the LED (the surface of the support substrate 30 of the wavelength converting member in the embodiment illustrated in FIG. 6). The thickness of the reflective material on the sides of the LEDs after cutting may be at least 30 µm in some embodiments, at least 50 µm in some embodiments, at least 100 µm in some embodiments, and no more than 500 µm in some embodiments.

In some embodiments, as illustrated in FIGS. 7, 8, 9, 10, and 11, the wavelength converting element wafer illustrated in FIG. 3 is attached to a group of LEDs after the LEDs are separated from a wafer of LEDs. In these embodiments, the LED wafer is diced before the wavelength converting element wafer. It may be difficult to simultaneously dice the wavelength converting element and the LED wafer, as described above in reference to FIG. 4.

Figure 7:
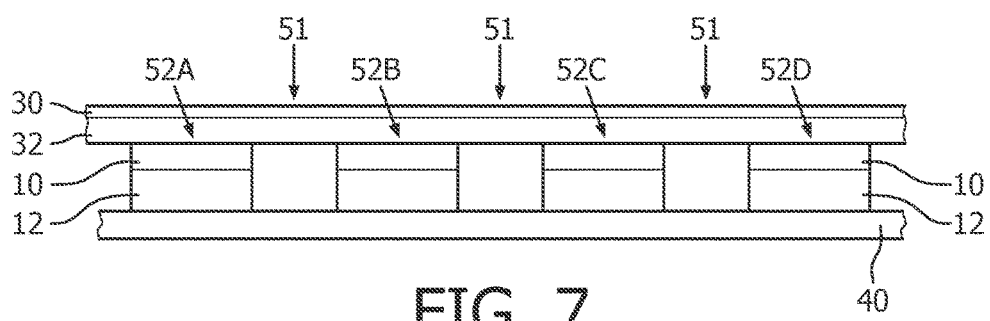
FIG. 7 illustrates individual LEDs disposed on a handling substrate with a wavelength converting layer disposed on a transparent layer attached to the LEDs.

In FIG. 7, previously diced LEDs are disposed on a handling substrate 40. Only a portion of a single handling substrate 40 including four LEDs 52A, 52B, 52C, and 52D is illustrated in FIG. 7. The processes illustrated in FIGS. 7-11 may be undertaken at a scale where hundreds of LEDs are disposed on a single handling substrate 40. The handling substrate 40 is any suitable structure from which the LEDs may be later removed, such as, for example, wafer handling tape.

A wavelength converting element wafer, as described above in FIG. 3, is attached to a top surface of the LEDs by any appropriate material or technique. The wavelength converting element wafer may be attached such that the wavelength converting layer 32 is disposed between the LEDs and the support substrate 30, as illustrated in FIG. 7, though the opposite orientation, where the support substrate 30 is disposed between the LEDs and the wavelength converting layer 32, is also possible.

Figure 8:
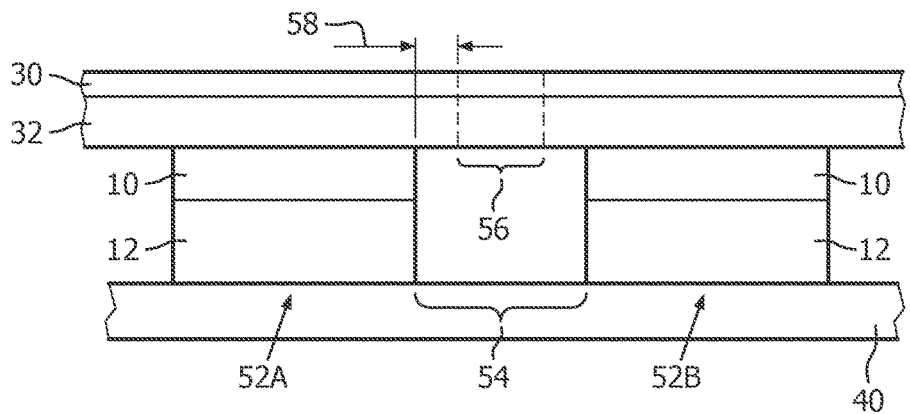
FIG. 8 illustrates singulating two of the LEDs illustrated in FIG. 7.

The wavelength converting element wafer is then cut in regions 51 to form single devices or groups of devices. Cutting the wavelength converting element wafer between two LEDs 52A and 52B is illustrated in FIG. 8.

In a completed device, the wavelength converting member over a single LED is preferably as close as possible to the size of the top surface of the LED, in order to limit the source size and thereby improve the efficiency of the device. Exemplary LEDs 52A and 52B are therefore spaced as close together on handling substrate 40 as possible. The spacing of LEDs 52A and 52B may be determined by the width of the kerf 56 resulting from cutting the wavelength converting element, and the tolerance of the wavelength converting element cutting operation.

The width of the kerf may vary depending on the cutting technique used. A kerf 56 formed by, for example, sawing, may be no more than 75 µm wide in some embodiments, no more than 50 µm wide in some embodiments, no more than 25 µm wide in some embodiments, and at least 10 µm wide in some embodiments.

The spacing 54 between neighboring devices may be no more than 150 µm in some embodiments, no more than 100 µm in some embodiments, no more than 50 µm in some embodiments, and at least 30 µm in some embodiments. The overhang 58, or the length that the wavelength converting member extends out beyond the LED after cutting, may be no more than 50 µm in some embodiments, no more than 30 µm in some embodiments, no more than 20 µm in some embodiments, and at least 10 µm in some embodiments.

As illustrated in FIG. 8, the wavelength converting layer 32 over each LED is substantially flat in that it does not extend down over the sides of the LED. In some embodiments, the area of the wavelength converting layer is larger than the area of the top surface of the LED. The area of the wavelength converting layer may be at least 100% of the area of the top surface of the LED in some embodiments, at least 110% of the area of the top surface of the LED in some embodiments, no more than 125% of the area of the top surface of the LED in some embodiments, no more than 150% of the area of the top surface of the LED in some embodiments, and no more than 200% of the area of the top surface of the LED in some embodiments. In some embodiments, the area of the wavelength converting layer is the same as the area of the top surface of the LED, or even slightly smaller than the area of the top surface of the LED.

Figure 9:
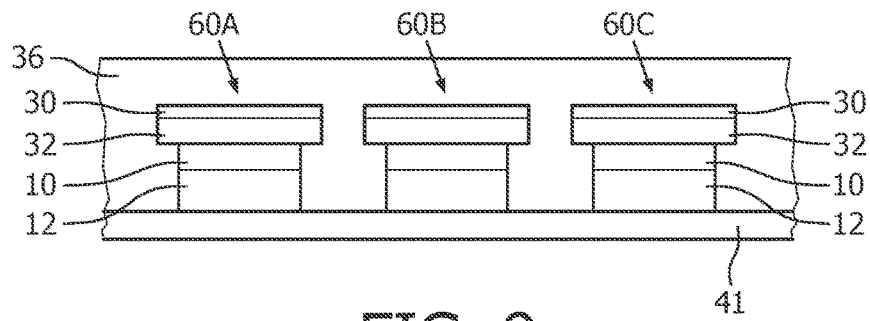
FIG. 9 illustrates the singulated LEDs of FIG. 7 disposed on a handling substrate, with a reflective material disposed over the LEDs.

In FIG. 9, after cutting the wavelength converting element wafer as illustrated in FIG. 8 to form individual LEDs or groups of LEDs, the LEDs 60A, 60B and 60C are removed from the handling substrate 40 and placed on a different handling substrate 41. The different handling substrate 41 may be any suitable material and may be the same type of handling substrate as handling substrate 40, such as, for example, wafer handling tape. Alternatively, the LEDs may be left on the handling substrate 40 illustrated in FIG. 8, which may be stretched to space the LEDs further apart. The LEDs in FIG. 9 may be spaced at least 100 µm apart in some embodiments, at least 150 µm apart in some embodiments, at least 200 µm apart in some embodiments, and no more than 500 µm apart in some embodiments.

A reflective material 36 is molded over the LEDs, as described above in reference to FIG. 5.

Figure 10:
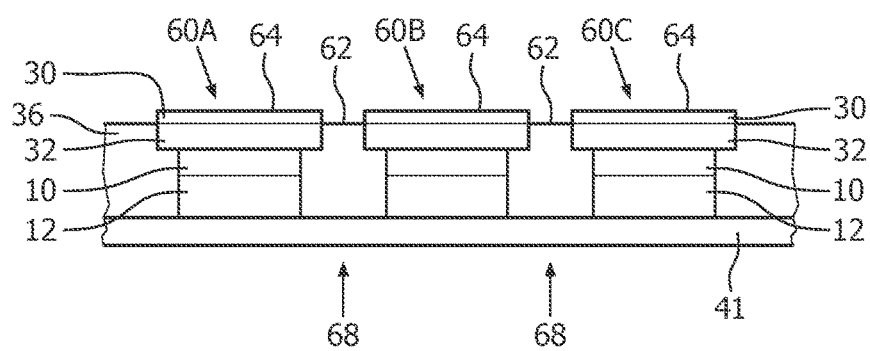
FIG. 10 illustrates the structure of FIG. 9 after removing excess reflective material.

In FIG. 10, excessive reflective material over the tops of the LEDs is removed, as described above in reference to FIG. 6. As described above in reference to FIG. 6, after the excessive material is removed, the tops 64 of LEDs 60A, 60B, and 60C are exposed. The top surface 64 is a surface of support substrate 30 opposite the wavelength converting layer 32. In some embodiments, the technique for removing excessive reflective material is selected to roughen, polish, texture, or pattern the top surface 64, for example to improve light extraction from the device.

In some embodiments, after removing the excessive reflective material, the top surface 62 of reflective material 36 between LEDs is at the same level as the top surface of LEDs 60A, 60B, 60C. In some embodiments, as illustrated in FIG. 10, after removing the excessive reflective material, the top surface 62 of reflective material 36 between LEDs is at a different level than the top surface 64 of LEDs 60A, 60B, 60C. In particular, the top surface 62 of reflective material 36 between LEDs may be below the top surface 64 of LEDs 60A, 60B, 60C. Reducing the thickness of the reflective material to below the top surface of the LEDs may be useful, for example, in embodiments as described below where the support substrate 30 is removed after forming the reflective material.

The reflective material may be cut in regions 68 to form individual LEDs or groups of LEDs, then the devices are removed from the handling substrate 41, as described above in reference to FIG. 6.

Figure 11:
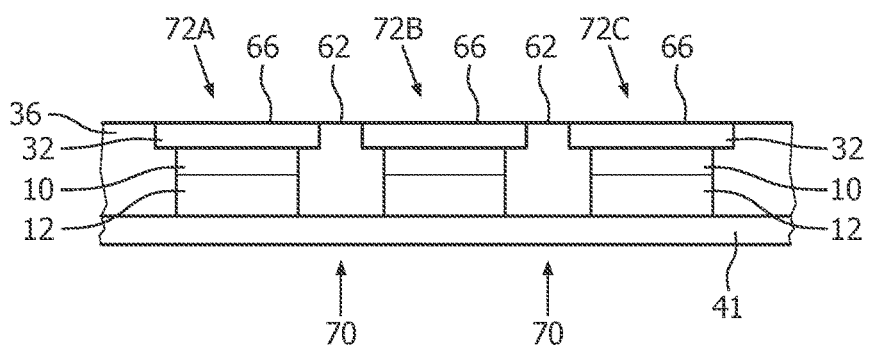
FIG. 11 illustrates the structure of FIG. 10 after removing the substrate from the wavelength converting layer.

FIG. 11 illustrates a device where the support substrate 30 is removed from the wavelength converting layer 32. In the structure illustrated in FIG. 11, after forming the reflective material and removing excess reflective material, but before cutting the reflective material to form individual LEDs or groups of LEDs illustrated in either FIG. 6 or FIG. 10, the support substrate 30 is removed from the devices.

In embodiments where the support substrate is removed, the support substrate may be a material that is selected for ease of removal. For example, the support substrate may be PET. A layer of adhesive such as a silicone adhesive or a thermal release adhesive may be disposed between the wavelength converting layer 32 and the support substrate 30 when the wavelength converting element illustrated in FIG. 3 is formed.

The support substrate pieces 30 illustrated in FIG. 6 or 10 may be removed by, for example, tape-to-tape transfer, thermal release, or any other suitable technique, resulting in the structure illustrated in FIG. 11.

After removing the support substrate, the top surface 66 of each of the three LEDs 72A, 72B, and 72C is a surface of the wavelength converting layer 32. The surface of wavelength converting layer 32 may be textured, patterned, or roughened, for example to improve light extraction, during or after the removal of the support substrate. During the removal of excess reflective material, the reflective material may be thinned such that after removing the support substrate, the top surface 66 of the LEDs is at substantially the same level as the top surface 62 of the reflective material 36, though this is not required—the top surfaces 66 of the LEDs may be above or below the top surface 62 of the reflective material.

After removing the support substrates, the reflective material between LEDs is cut in regions 70, to separate the devices into individual LEDs or groups of LEDs.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A lighting structure comprising:
a semiconductor light emitting device;
a substantially flat wavelength converting element attached to the semiconductor light emitting device, an area of a bottom surface of the wavelength converting element facing the semiconductor light emitting device being greater than an area of a top surface of the semiconductor light emitting device, the substantially flat wavelength converting element comprising:
a wavelength converting layer having first side edges extending up from the bottom surface; and
a transparent layer, the wavelength converting layer being formed on the transparent layer, the transparent layer having second side edges extending down from an upper surface of the wavelength converting element, and even with the first side edges of the wavelength converting layer; and
a reflector in direct contact with a side of the semiconductor light emitting device, the first side edges, and a portion of the bottom surface extending beyond the top surface of the semiconductor light emitting device.

2. The lighting structure of claim 1 wherein an area of the substantially flat wavelength converting element is no more than 150% of an area of a top surface of the semiconductor light emitting device.

3. The lighting structure of claim 1 wherein the transparent layer is glass and the wavelength converting layer is phosphor mixed with a transparent material and laminated on the glass.

4. The lighting structure of claim 1 wherein a length that the wavelength converting member extends beyond an edge the semiconductor light emitting device is no more than 30 µm.

5. The lighting structure of claim 1 wherein the semiconductor light emitting device comprises a semiconductor structure disposed on a growth substrate, the flat wavelength converting element being attached to the growth substrate, and the reflector being in direct contact with a side of the growth substrate.

6. The lighting structure of claim 1 wherein the reflector comprises particles disposed in a transparent material.

7. A method comprising:
forming a wavelength converting element comprising a wavelength converting layer disposed on a transparent layer;
after said forming, attaching the wavelength converting element to a wafer of semiconductor light emitting devices;
after said attaching, dicing the wavelength converting element and the wafer of semiconductor light emitting devices to form a plurality of lighting elements;
after said dicing, disposing the plurality of lighting elements on a handling substrate; and
disposing a reflective material between the plurality of lighting elements.

8. The method of claim 7 wherein forming a wavelength converting element comprises laminating a wavelength converting layer on a glass layer.

9. The method of claim 7 further comprising removing the transparent layer after said attaching.

10. The method of claim 7 wherein disposing a reflective material between the plurality of lighting elements comprises covering a top surface of the wavelength converting elements with reflective material, the method further comprising removing reflective material disposed on the top surface of the wavelength converting elements.

11. The method of claim 7 further comprising texturing a top surface of the wavelength converting elements.

12. The method of claim 7 wherein the reflective material comprises particles disposed in a transparent material.

13. A method comprising:
forming a wavelength converting element comprising a wavelength converting layer disposed on a transparent layer, the wavelength converting element being rigid;
after said forming, attaching the wavelength converting element to a plurality of diced semiconductor light emitting devices disposed on a first handling substrate;
after said attaching, dicing the wavelength converting element to form a plurality of lighting elements,
after said dicing, disposing the plurality of lighting elements on a second handling substrate; and
disposing a reflective material between the plurality of lighting elements.

14. The method of claim 13 wherein forming a wavelength converting element comprises laminating a wavelength converting layer on a transparent layer.

15. The method of claim 13 further comprising removing the transparent layer after said dicing.

16. The method of claim 15 wherein:
the wavelength converting element comprises a thermal release layer disposed between the wavelength converting layer and the transparent layer; and
removing the transparent layer comprises removing by thermal release.

17. The method of claim 13 wherein each diced semiconductor light emitting device in the plurality of diced semiconductor light emitting devices comprises a semiconductor structure and a growth substrate and the wavelength converting element is attached to the growth substrates.

18. The method of claim 13 wherein the reflective material comprises particles disposed in a transparent material.

19. The method of claim 13 wherein disposing a reflective material between the plurality of lighting elements comprises covering a top surface of the wavelength converting elements with reflective material, the method further comprising removing reflective material disposed on the top surface of the wavelength converting elements.

* * * * *